United States Patent
Hagishima

(10) Patent No.: US 10,482,963 B2
(45) Date of Patent: Nov. 19, 2019

(54) SEMICONDUCTOR MEMORY DEVICE

(71) Applicant: Toshiba Memory Corporation, Minato-ku (JP)

(72) Inventor: Daisuke Hagishima, Meguro (JP)

(73) Assignee: Toshiba Memory Corporation, Minato-ku (JP)

( * ) Notice: Subject to any disclaimer, the term of this patent is extended or adjusted under 35 U.S.C. 154(b) by 104 days.

(21) Appl. No.: 15/703,078

(22) Filed: Sep. 13, 2017

(65) Prior Publication Data

US 2018/0075908 A1    Mar. 15, 2018

(30) Foreign Application Priority Data

Sep. 14, 2016 (JP) ................. 2016-180014

(51) Int. Cl.
| | |
|---|---|
| *G11C 16/04* | (2006.01) |
| *G11C 16/10* | (2006.01) |
| *G11C 16/26* | (2006.01) |
| *H01L 27/11519* | (2017.01) |
| *H01L 27/11556* | (2017.01) |
| *H01L 27/11582* | (2017.01) |
| *H01L 29/10* | (2006.01) |

(Continued)

(52) U.S. Cl.
CPC ......... *G11C 16/0483* (2013.01); *G11C 16/10* (2013.01); *G11C 16/26* (2013.01); *H01L 27/11519* (2013.01); *H01L 27/11556* (2013.01); *H01L 27/11582* (2013.01); *H01L 29/1037* (2013.01); *H01L 29/42328* (2013.01); *H01L 29/42344* (2013.01); *G11C 16/0408* (2013.01); *G11C 16/0466* (2013.01); *H01L 27/11565* (2013.01); *H01L 29/7883* (2013.01)

(58) Field of Classification Search
CPC ............................ G11C 16/0483; G11C 5/025
USPC .................................................. 365/185.17
See application file for complete search history.

(56) References Cited

U.S. PATENT DOCUMENTS

| | | | |
|---|---|---|---|
| 7,969,789 B2 * | 6/2011 | Katsumata | .......... G11C 11/5671 365/185.17 |
| 2010/0176435 A1 * | 7/2010 | Sato | .................. H01L 27/11519 257/319 |

(Continued)

FOREIGN PATENT DOCUMENTS

| | | |
|---|---|---|
| JP | 2015-50466 A | 3/2015 |
| JP | 2015-177013 | 10/2015 |

*Primary Examiner* — Huan Hoang
*Assistant Examiner* — Muna A Techane
(74) *Attorney, Agent, or Firm* — Oblon, McClelland, Maier & Neustadt, L.L.P.

(57) ABSTRACT

According to one embodiment, a semiconductor memory device includes a stacked body including a first stacked region, and a first structure body. The first stacked region includes first and second selection gate electrodes, first electrodes arranged in a first direction and provided between the first and second selection gate electrodes, second electrodes arranged in the first direction and provided between the second selection gate electrode and the first electrodes, and third electrodes arranged in the first direction and provided between the first electrodes and the second electrodes. A first spacing between two mutually-adjacent first electrodes is wider than a third spacing between two mutually-adjacent third electrodes. A second spacing between two mutually-adjacent second electrodes is wider than the third spacing.

20 Claims, 6 Drawing Sheets

(51) Int. Cl.
*H01L 29/423* (2006.01)
*H01L 27/11565* (2017.01)
*H01L 29/788* (2006.01)

(56) References Cited

U.S. PATENT DOCUMENTS

| | | | |
|---|---|---|---|
| 2010/0322009 A1* | 12/2010 | Shimane | G11C 16/0483 365/185.18 |
| 2011/0063914 A1* | 3/2011 | Mikajiri | G11C 5/02 365/185.15 |
| 2012/0081958 A1* | 4/2012 | Lee | G11C 16/0483 365/185.05 |
| 2012/0235222 A1* | 9/2012 | Kamigaichi | H01L 27/11519 257/324 |
| 2013/0341703 A1* | 12/2013 | Shinohara | H01L 29/66833 257/326 |
| 2015/0263036 A1* | 9/2015 | Yasuda | H01L 27/11582 257/324 |
| 2016/0005474 A1 | 1/2016 | Goda et al. | |
| 2017/0103999 A1* | 4/2017 | Lee | H05K 999/99 |

* cited by examiner

SEMICONDUCTOR MEMORY DEVICE

CROSS-REFERENCE TO RELATED APPLICATIONS

This application is based upon and claims the benefit of priority from Japanese Patent Application No. 2016-180014, filed on Sep. 14, 2016; the entire contents of which are incorporated herein by reference.

FIELD

Embodiments described herein relate generally to a semiconductor memory device.

BACKGROUND

Stable operations of a semiconductor memory device are desirable.

DETAILED DESCRIPTION

Figure 1:
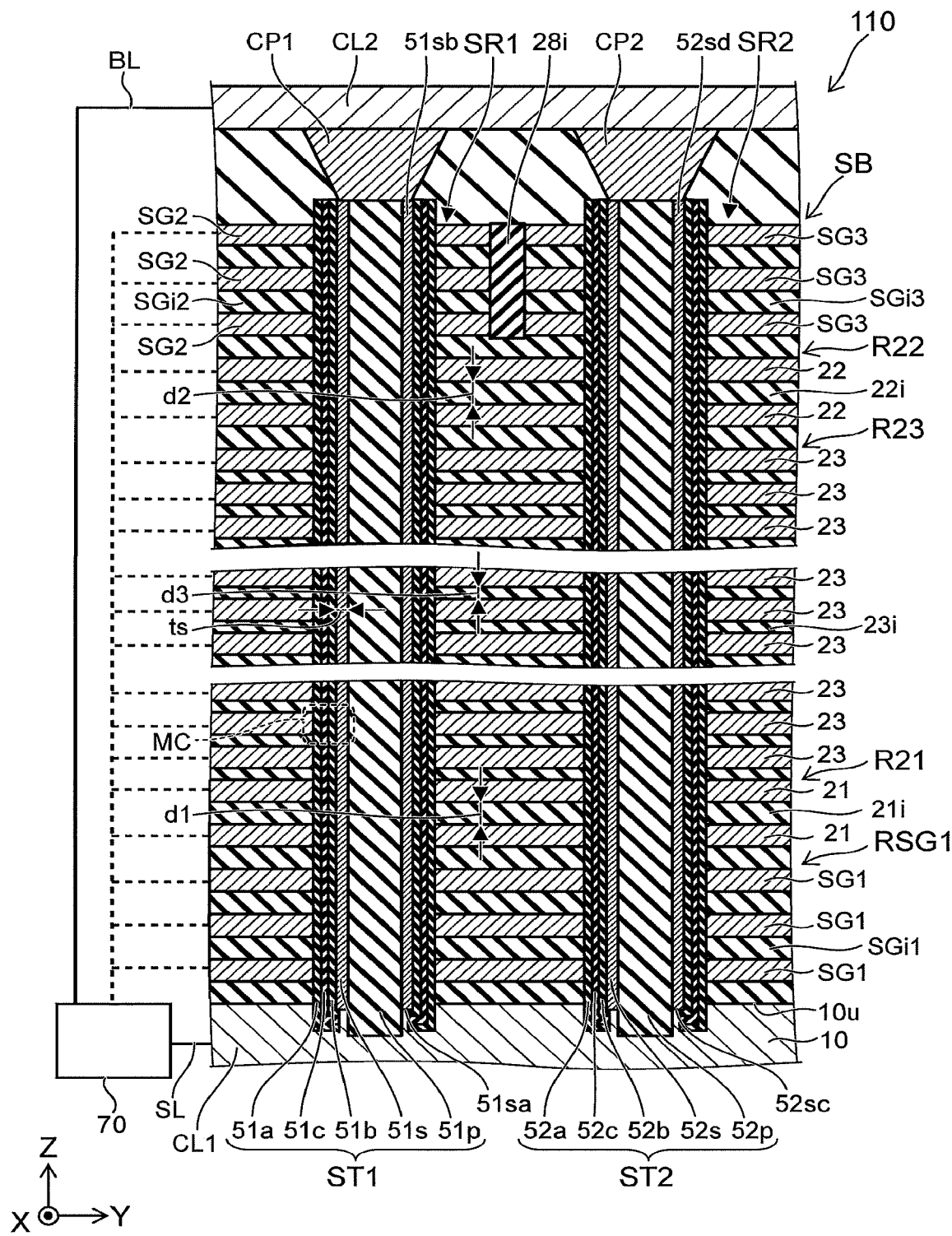
FIG. 1 is a schematic cross-sectional view illustrating a semiconductor memory device according to a first embodiment.

According to one embodiment, a semiconductor memory device includes a stacked body including a first stacked region, and a first structure body. The first stacked region includes a first selection gate electrode, a second selection gate electrode separated from the first selection gate electrode in a first direction, a plurality of first electrodes arranged in the first direction and provided between the first selection gate electrode and the second selection gate electrode, a plurality of second electrodes arranged in the first direction and provided between the second selection gate electrode and the first electrodes, and a plurality of third electrodes arranged in the first direction and provided between the first electrodes and the second electrodes. A first spacing between two mutually-adjacent first electrodes of the first electrodes is wider than a third spacing between two mutually-adjacent third electrodes of the third electrodes. A second spacing between two mutually-adjacent second electrodes of the second electrodes is wider than the third spacing. The first structure body includes a first semiconductor body extending in the first direction, a first outer film provided between the first semiconductor body and the first stacked region, a first inner film provided between the first semiconductor body and the first outer film, and a first intermediate film provided between the first outer film and the first inner film.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a semiconductor memory device according to a first embodiment.

As shown in FIG. 1, the semiconductor memory device 110 includes a stacked body SB and a first structure body ST1. In the example, the semiconductor memory device 110 includes a second structure body ST2.

The stacked body SB includes a first stacked region SR1.

The first stacked region SR1 includes a first selection gate electrode SG1, a second selection gate electrode SG2, multiple first electrodes 21, multiple second electrodes 22, and multiple third electrodes 23.

The second selection gate electrode SG2 is separated from the first selection gate electrode SG1 in a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

A base body 10 is provided in the example. The stacked body SB is provided on a surface 10*u* (e.g., the upper surface) of the base body 10. The Z-axis direction crosses the surface 10*u*. For example, the Z-axis direction is perpendicular to the surface 10*u*.

Multiple first selection gate electrodes SG1 are provided in the example. The multiple first selection gate electrodes SG1 are arranged in the Z-axis direction. An inter-layer insulating film SGi1 is provided between the multiple first selection gate electrodes SG1. The number of the first selection gate electrodes SG1 may be one, two, or more.

Multiple second selection gate electrodes SG2 are provided in the example. The multiple second selection gate electrodes SG2 are arranged in the Z-axis direction. An inter-layer insulating film SGi2 is provided between the multiple second selection gate electrodes SG2. The number of the second selection gate electrodes SG2 may be one, two, or more.

The multiple first electrodes 21 are provided between the first selection gate electrode SG1 and the second selection gate electrode SG2. The multiple first electrodes 21 are arranged in the first direction (the Z-axis direction). In the example, an inter-layer insulating film 21*i* may be provided between the multiple first electrodes 21.

The multiple second electrodes 22 are provided between the second selection gate electrode SG2 and the multiple first electrodes 21. The multiple second electrodes 22 are arranged in the first direction (the Z-axis direction). An inter-layer insulating film 22*i* is provided between the multiple second electrodes 22.

The multiple third electrodes 23 are provided between the multiple first electrodes 21 and the multiple second electrodes 22. The multiple third electrodes 23 are arranged in the first direction. In the example, an inter-layer insulating film 23i is provided between the multiple third electrodes 23.

The first structure body ST1 includes a first semiconductor body 51s, a first outer film 51a, a first inner film 51b, and a first intermediate film 51c. The first semiconductor body 51s extends in the first direction (the Z-axis direction). The first outer film 51a is provided between the first semiconductor body 51s and the first stacked region SR1. The first inner film 51b is provided between the first semiconductor body 51s and the first outer film 51a. The first intermediate film 51c is provided between the first outer film 51a and the first inner film 51b.

In the example, the first structure body ST1 further includes a first core portion 51p. The first core portion 51p extends in the first direction (the Z-axis direction). The films recited above are provided around the first core portion 51p. The first core portion 51p may be omitted.

For example, transistors are formed at the portions where the first semiconductor body 51s and the multiple third electrodes 23 cross. The transistors function as memory cells MC. The multiple electrodes that are provided between the two selection gate electrodes function as, for example, word lines.

The first outer film 51a functions as, for example, a blocking insulating film. The first inner film 51b functions as, for example, a tunneling insulating film. The first intermediate film 51c functions as, for example, a charge storage film. For example, the threshold voltage of the transistor of the memory cell MC changes according to the amount of the charge stored in the first intermediate film 51c. The difference of the threshold voltage corresponds to the information stored in the semiconductor memory device 110. The information that is stored is read by reading a value (a current or a voltage) corresponding to the threshold voltage.

In the embodiment, a first spacing d1 between two mutually-adjacent first electrodes 21 of the multiple first electrodes 21 is wider than a third spacing d3 between two mutually-adjacent third electrodes 23 of the multiple third electrodes 23. A second spacing d2 between two mutually-adjacent second electrodes 22 of the multiple second electrodes 22 is wider than the third spacing d3.

Thereby, the programming is stabilized. For example, misprogramming to unselected cells can be reduced. For example, in the program operation, the difference between the threshold voltage of the selected cell and the threshold voltages of the unselected cells can be large. The reliability can be increased. A semiconductor memory device can be provided in which the operational stability can be improved.

For example, the multiple first electrodes 21, the multiple second electrodes 22, and the multiple third electrodes 23 form one string. The first selection gate electrode SG1 is provided at one end of the string; and the second selection gate electrode SG2 is provided at the other end. It is considered that pairs of electrons and holes are generated in the first semiconductor body 51s at portions of the string proximal to the selection gate electrodes. There are cases where charge is injected into the unselected cells due to the pairs of electrons and holes. For example, it is considered that the pairs of electrons and holes are generated by tunneling between the bands.

In the embodiment, for example, the spacing between the multiple electrodes proximal to the selection gate electrodes (e.g., the first spacing d1 and the second spacing d2) are set to be wider (larger) than the spacing between the multiple electrodes distal to the selection gate electrodes (e.g., the third spacing d3). The electric field is relaxed at the portions of the string proximal to the selection gate electrodes. Thereby, for example, the tunneling between the bands is suppressed. The generation of the pairs of electrons and holes is suppressed. For example, the injection of the charge into the unselected cells is suppressed. For example, the misprogramming to the unselected cells can be suppressed. The program operation is stable.

In the example as shown in FIG. 1, the stacked body SB further includes a third selection gate electrode SG3.

The direction that connects the second selection gate electrode SG2 and the third selection gate electrode SG3 is aligned with the second direction. The second direction crosses the first direction (the Z-axis direction). In the example, the second direction is the Y-axis direction.

Multiple third selection gate electrodes SG3 are provided in the example. The multiple third selection gate electrodes SG3 are arranged in the Z-axis direction. An inter-layer insulating film SGi3 is provided between the multiple third selection gate electrodes SG3. The number of the third selection gate electrodes SG3 may be one, two, or more.

The first selection gate electrode SG1 includes a region (a first selection gate region RSG1) separated from the third selection gate electrode SG3 in the first direction (the Z-axis direction). The multiple first electrodes 21 include a region (a first electrode region R21) between the first selection gate region RSG1 and the third selection gate electrode SG3. The multiple second electrodes 22 include a region (a second electrode region R22) between the first selection gate region RSG1 and the first electrode region R21. The multiple third electrodes 23 include a region (a third electrode region R23) between the first electrode region R21 and the second electrode region R22.

The stacked body SB includes a second stacked region SR2. The second stacked region SR2 includes the first selection gate region RSG1, the third selection gate electrode SG3, the first electrode region R21, the second electrode region R22, and the third electrode region R23 recited above.

The semiconductor memory device 110 further includes the second structure body ST2. The second structure body ST2 includes a second semiconductor body 52s, a second outer film 52a, a second inner film 52b, and a second intermediate film 52c.

The second semiconductor body 52s extends in the first direction (the Z-axis direction). The second outer film 52a is provided between the second semiconductor body 52s and the second stacked region SR2. The second inner film 52b is provided between the second semiconductor body 52s and the second outer film 52a. The second intermediate film 52c is provided between the second outer film 52a and the second inner film 52b. In the example, the second structure body ST2 further includes a second core portion 52p. The second core portion 52p extends in the first direction (the Z-axis direction). The films recited above are provided around the second core portion 52p. The second core portion 52p may be omitted.

The second structure body ST2 forms one other string.

The first semiconductor body 51s includes a first end portion 51sa and a second end portion 51sb. The second semiconductor body 52s includes a third end portion 52sc and a fourth end portion 52sd. These end portions are electrically connected to interconnects (conductive layers).

In the example, the semiconductor memory device 110 further includes a first conductive layer CL1 and a second conductive layer CL2. The first conductive layer CL1 is electrically connected to the first end portion 51sa and the third end portion 52sc. The second conductive layer CL2 is electrically connected to the second end portion 51sb and the fourth end portion 52sd.

The first conductive layer CL1 may be, for example, a portion of the base body 10. For example, the first conductive layer CL1 is electrically connected to a source line SL.

In the example, the second conductive layer CL2 is electrically connected to the second end portion 51sb of the first semiconductor body 51s via a first contact electrode CP1. The second conductive layer CL2 is electrically connected to the fourth end portion 52sd of the second semiconductor body 52s via a second contact electrode CP2. The second conductive layer CL2 is, for example, a bit line BL.

For example, a controller 70 is provided. The controller 70 may include electric circuit, for example. The controller 70 is electrically connected to the first conductive layer CL1, the second conductive layer CL2, the first selection gate electrode SG1, the second selection gate electrode SG2, the multiple first electrodes 21, the multiple second electrodes 22, and the multiple third electrodes 23.

An example of the program operation of the semiconductor memory device 110 will now be described.

Figure 2A:
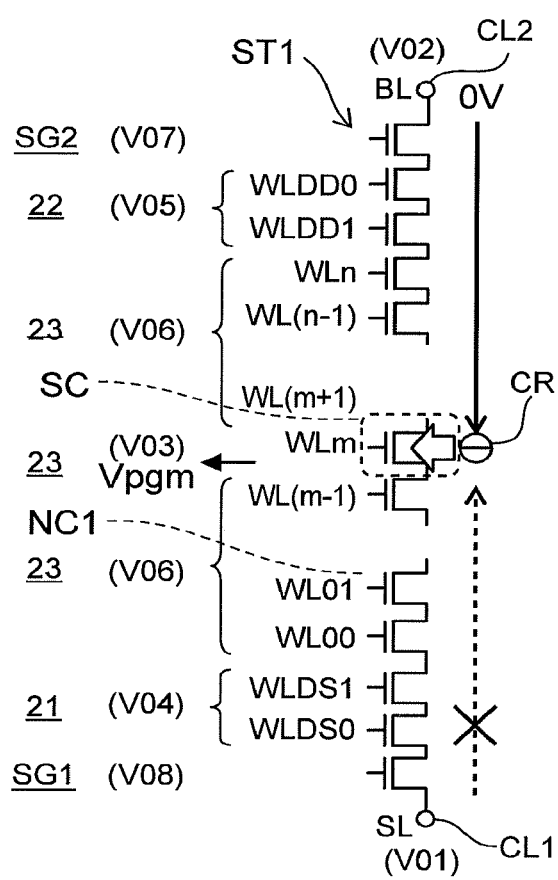
FIG. 2A and FIG. 2B are schematic views illustrating an operation of the semiconductor memory device according to the first embodiment.
Figure 2B:
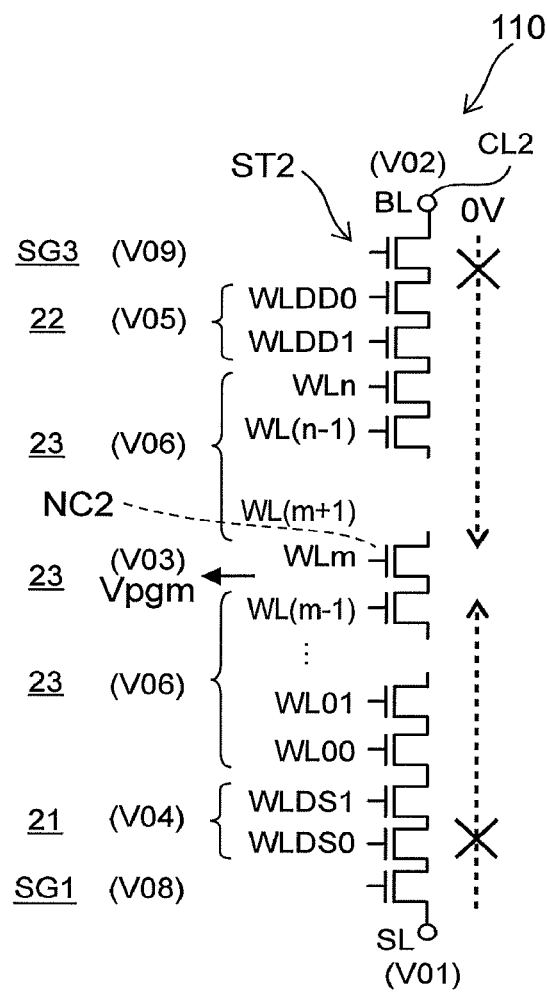

FIG. 2A and FIG. 2B are schematic views illustrating an operation of the semiconductor memory device according to the first embodiment.

FIG. 2A and FIG. 2B respectively illustrate the potentials of the string of the first structure body ST1 and the string of the second structure body ST2. In the example, one memory cell MC that is included in the string of the first structure body ST1 is a selected cell SC. The selected cell SC corresponds to one of the multiple third electrodes 23. In the example, the transistors that correspond to the multiple third electrodes 23 are used to store the information. The transistors that correspond to the multiple first electrodes 21 and the multiple second electrodes 22 are not used to store information. The transistors that correspond to the multiple first electrodes 21 and the multiple second electrodes 22 are, for example, dummy transistors.

The first operation that performs the programming of the selected cell SC is performed by the controller 70 as follows. In the first operation, the controller 70 sets the first conductive layer CL1 to a first potential V01 and sets the second conductive layer CL2 to a second potential V02. In the example, the first potential V01 and the second potential V02 are 0 V (volts).

In the first operation, the controller 70 sets the one of the multiple third electrodes 23 to a third potential V03. In the example, the multiple third electrodes 23 are electrodes WL00 to WLn. The one of the multiple third electrodes 23 corresponds to the selected cell SC. The one of the multiple third electrodes 23 corresponds to the selected electrode. The third potential V03 is higher than the first potential V01 and higher than the second potential V02. In the example, the third potential V03 is a programming voltage Vpgm. The third potential V03 is, for example, 20 V.

In the first operation, the controller 70 sets the multiple first electrodes 21 to a fourth potential V04. In the example, the multiple first electrodes 21 are electrodes WLDS0 and WLDS1. In the first operation, the controller 70 sets the multiple second electrodes 22 to a fifth potential V05. In the example, the multiple second electrodes 22 are electrodes WLDD0 and WLDD1. The fourth potential V04 is between the first potential V01 and the third potential V03. The fifth potential V05 is between the second potential V02 and the third potential V03. In the example, the fourth potential V04 is 6 V. In the example, the fifth potential V05 is 6 V.

In the first operation, the controller 70 sets, to a sixth potential V06, at least another one of the multiple third electrodes 23 (an unselected cell NC1) other than the one of the multiple third electrodes 23 recited above. The sixth potential V06 is between the fourth potential V04 and the third potential V03 and between the fifth potential V05 and the third potential V03. In the example, the sixth potential V06 is 10 V.

In the first operation, the controller 70 sets the second selection gate electrode SG2 to a seventh potential V07. The seventh potential V07 is lower than the fourth potential V04 and lower than the fifth potential V05. In the example, the seventh potential V07 is 3 V. The seventh potential V07 is, for example, higher than the first potential V01 and higher than the second potential V02.

In the first operation, the controller 70 sets the first selection gate electrode SG1 to an eighth potential V08. The eighth potential V08 is lower than the seventh potential V07. In the example, the eighth potential V08 is 0 V. In the example, the eighth potential V08 is the same as the first potential V01 and the second potential V02.

In the first operation, the controller 70 sets the third selection gate electrode SG3 to a ninth potential V09. The ninth potential V09 is lower than the seventh potential V07. In the example, the ninth potential V09 is 0 V. The ninth potential V09 is, for example, the same as the first potential V01 and the second potential V02.

By such a first operation, for example, an inversion layer is formed in the first semiconductor body 51s between the first conductive layer CL1 and the one of the multiple third electrodes 23 recited above (the electrode of the selected cell). Thereby, a charge CR is injected into the first intermediate film 51c corresponding to the one (the selected cell SC) of the multiple third electrodes 23 recited above from the first semiconductor body 51s. The injection is due to, for example, FN (Fowler-Nordheim) current. The charge CR that is injected is accumulated in the first intermediate film 51c. Thus, information is programmed to the selected cell SC by the first operation.

On the other hand, for the other unselected cell NC1 of the string corresponding to the first structure body ST1, an injection of the charge substantially is not performed because the potential of the electrode is the fourth potential V04, the fifth potential V05, or the sixth potential V06.

On the other hand, for a cell (an unselected cell NC2) of the string corresponding to the second structure body ST2, the channel is set to the off-state because the potential of the third selection gate electrode SG3 is the ninth potential V09. A current substantially does not flow in the second semiconductor body 52s. Therefore, for the memory cell MC formed of the second structure body ST2 and the selected electrode recited above, an injection of the charge substantially does not occur even when the third potential V03 (the programming voltage Vpgm) is applied to the selected electrode.

Thus, the information can be programmed to the desired selected cell by the first operation.

In the first operation such as that recited above, for example, the multiple first electrodes 21 that are proximal to the first selection gate electrode SG1 are set to the fourth potential V04 (an intermediate voltage, and in the example, 6 V). For example, the multiple second electrodes 22 that are proximal to the second selection gate electrode SG2 are set to the fifth potential V05 (an intermediate voltage, and in the example, 6 V). Therefore, the generation of the pairs of electrons and holes is suppressed further compared to a reference example in which these intermediate potentials are not provided. In the reference example, for example, only the multiple third electrodes 23 are provided between the first selection gate electrode SG1 and the second selection gate electrode SG2; and the multiple first electrodes 21 and the multiple second electrodes 22 recited above are not provided.

In such a case, in the embodiment, the spacing (the first spacing d1) between the multiple first electrodes 21 set to the intermediate potential and the spacing (the second spacing d2) between the multiple second electrodes 22 set to the intermediate potential are set to be wide. As recited above, the first spacing d1 and the second spacing d2 each are set to be wider than the spacing (the third spacing d3) between the multiple third electrodes 23. Thereby, for example, the generation of the pairs of electrons and holes due to the tunneling between the bands is suppressed; and the injection of the charge into the unselected cells is suppressed. As a result, the misprogramming to the unselected cells decreases. The program operation is stable.

For example, according to the embodiment, a boost characteristic described below can be improved. The boost characteristic is a characteristic relating to the difference between the threshold characteristic of the selected cell SC and the threshold characteristic of the unselected cells (e.g., the unselected cell NC2, etc., recited above).

Figure 3:
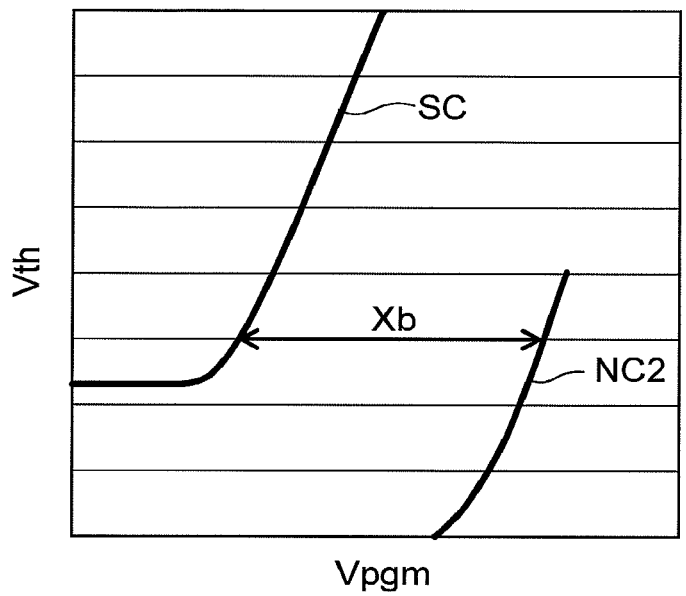
FIG. 3 is a graph illustrating a characteristic of the semiconductor memory device according to the embodiment.

FIG. 3 is a graph illustrating a characteristic of the semiconductor memory device according to the embodiment.

The horizontal axis of FIG. 3 is the programming voltage Vpgm. The vertical axis is a threshold voltage Vth. The characteristic of the selected cell SC and the characteristic of the unselected cell NC2 are shown in these figures.

In the selected cell SC as shown in FIG. 3, the threshold voltage Vth starts to increase when the programming voltage Vpgm exceeds 20 V. The threshold voltage Vth increases when the programming voltage Vpgm increases. On the other hand, for the unselected cell NC2 as well, the threshold voltage Vth starts to increase when the programming voltage Vpgm becomes excessively high. Thereby, for example, there are cases where misprogramming to the unselected cell NC2 occurs.

For example, the difference between the programming voltage Vpgm of the unselected cell NC2 and the programming voltage Vpgm of the selected cell SC where the threshold voltage Vth reaches 1 V is taken as a boost characteristic value Xb. In the embodiment, the boost characteristic value Xb can be large.

For example, in one reference example (a semiconductor memory device 119), the thickness is 28 nm for each of the multiple first electrodes 21, each of the multiple second electrodes 22, and each of the multiple third electrodes 23. The spacing (the first spacing d1) between the multiple first electrodes 21, the spacing (the second spacing d2) between the multiple second electrodes 22, and the spacing (the third spacing d3) between the multiple third electrodes 23 each are 30 nm.

On the other hand, in one example (a semiconductor memory device 110a) of the semiconductor memory device 110 according to the embodiment, the thickness is 28 nm for each of the multiple first electrodes 21, each of the multiple second electrodes 22, and each of the multiple third electrodes 23. The first spacing d1 and the second spacing d2 each are 35 nm; and the third spacing d3 is 30 nm. The boost characteristic value Xb of the semiconductor memory device 110a is larger than the boost characteristic value Xb of the semiconductor memory device 119. The difference between the former and the latter is 0.22 V. An improvement of 0.22 V is obtained.

On the other hand, in another example (a semiconductor memory device 110b) of the semiconductor memory device 110 according to the embodiment, the thickness is 28 nm for each of the multiple first electrodes 21, each of the multiple second electrodes 22, and each of the multiple third electrodes 23. The first spacing d1 and the second spacing d2 each are 39 nm; and the third spacing d3 is 30 nm. The boost characteristic value Xb of the semiconductor memory device 110b is larger than the boost characteristic value Xb of the semiconductor memory device 119. The difference between the former and the latter is 0.37 V. An improvement of 0.37 V is obtained.

Thus, in the embodiment, the boost characteristic value Xb can be larger than that of a reference example in which the spacing is uniform. Thereby, the misprogramming can be suppressed. A semiconductor memory device can be provided in which the operational stability can be improved.

Figure 4:
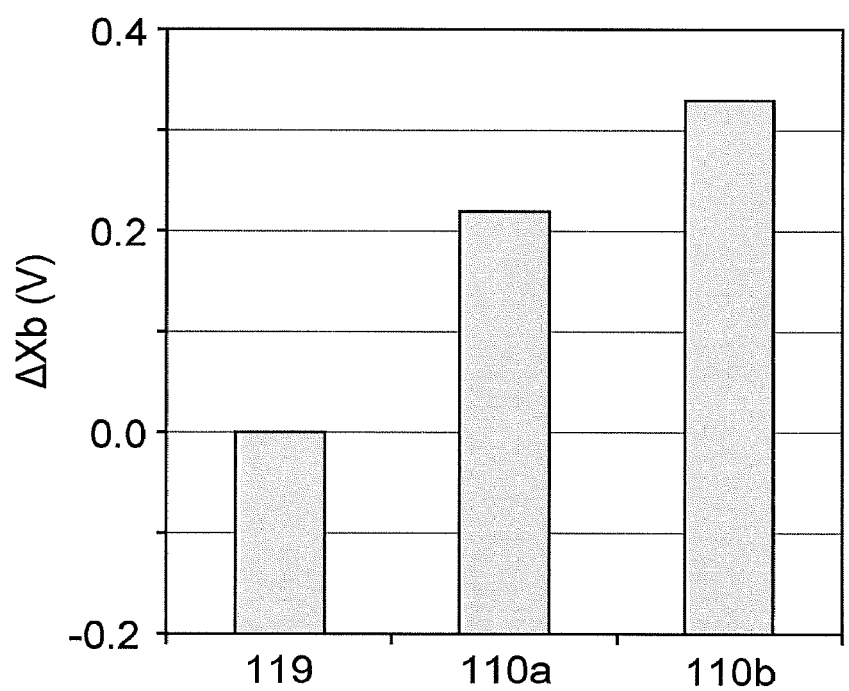
FIG. 4 is a graph illustrating a characteristic of the semiconductor memory devices.

FIG. 4 is a graph illustrating a characteristic of the semiconductor memory devices.

FIG. 4 shows the improvement degree of the boost characteristic value for the semiconductor memory devices 110a and 110b when referenced to the reference example (the semiconductor memory device 119) recited above. The vertical axis is a difference ΔXb between the boost characteristic value Xb of the semiconductor memory device 119 and the boost characteristic value Xb of the semiconductor memory device 110a or 110b.

As shown in FIG. 4, the difference ΔXb of the semiconductor memory device 110a is 0.22 V. The difference ΔXb of the semiconductor memory device 110b is 0.37 V.

In the embodiment, the absolute value of the difference between the first spacing d1 and the third spacing d3 is, for example, not less than 2 nanometers and not more than 10 nanometers. The absolute value the difference between the second spacing d2 and the third spacing d3 is, for example, not less than 2 nanometers and not more than 10 nanometers.

In the embodiment, the first spacing d1 is, for example, not less than 1.05 times and not more than 1.5 times the third spacing d3. The second spacing d2 is, for example, not less than 1.05 times and not more than 1.5 times the third spacing d3.

For example, the electrodes for which the spacing is set to be locally wide are positioned at the ends of the multiple electrodes. For example, the total of a first length in the first direction (the Z-axis direction) of the region including the multiple first electrodes 21, a second length in the first direction of the region including the multiple second electrodes 22, and a third length in the first direction of the region including the multiple third electrodes 23 corresponds to the length of one string. The ratio of the first length recited above to this total (the length of one string) is, for example, not less than 0.05 and not more than 0.15. The spacing between the electrodes is widened locally for the electrodes included in the regions having lengths that are not less than 0.05 times and not more than 0.15 times the length of the entirety. Thereby, the misprogramming is suppressed; and the operational stability can be improved.

In the semiconductor memory device 110, for example, a second operation of erasing may be performed by the controller 70. For example, the controller 70 may further implement the second operation of setting the potential of at least one of the multiple third electrodes 23 to be lower than the potential of the first conductive layer CL1 and lower than the potential of the second conductive layer CL2. Thereby, the erasing is performed.

In the semiconductor memory device 110, for example, a third operation of reading may be performed by the controller 70. For example, in the third operation, the controller 70 sets the first conductive layer CL1 to a twelfth potential and sets the second conductive layer CL2 to a thirteenth potential. The thirteenth potential is different from the twelfth potential. In the third operation, the controller 70 sets at least one of the multiple third electrodes 23 to a fourteenth potential. The absolute value of the difference between the fourteenth potential and the twelfth potential and the absolute value of the difference between the fourteenth potential and the thirteenth potential each are less than the absolute value of the difference between the third potential V03 and the first potential V01. In this state, the controller 70 senses a value (e.g., at least one of a voltage or a current) corresponding to the threshold voltage of the transistor corresponding to the at least one of the multiple third electrodes 23. Thereby, the memory state of the transistor can be sensed. In other words, the information is read.

In the example described in reference to FIGS. 2A and 2B, the absolute value of the difference between the sixth potential V06 and the first potential V01 is not less than 0.4 times and not more than 0.6 times the absolute value of the difference between the third potential V03 and the first potential V01. For example, the absolute value of the difference between the sixth potential V06 and the first potential V01 is about 0.5 times the absolute value of the difference between the third potential V03 and the first potential V01.

The absolute value of the difference between the fourth potential V04 and the first potential V01 is, for example, not less than 0.4 times and not more than 0.8 times the difference between the sixth potential V06 and the first potential V01. The absolute value of the difference between the fourth potential V04 and the first potential V01 is, for example, about 0.6 times the difference between the sixth potential V06 and the first potential V01.

In the embodiment, the first outer film 51a and the second outer film 52a include, for example, aluminum oxide, etc. These outer films are insulative. The first inner film 51b and the second inner film 52b include, for example, silicon oxide, etc. These inner films are tunneling insulating films. The first intermediate film 51c and the second intermediate film 52c include, for example, silicon nitride. These intermediate films may include, for example, polysilicon. The first core portion 51p and the second core portion 52p include, for example, silicon oxide, etc. These materials are examples; and the materials of these films in the embodiment are arbitrary.

The first semiconductor body 51s and the second semiconductor body 52s include, for example, silicon (e.g., polysilicon).

In the embodiment, the thickness of the semiconductor body is about 20 nanometers. As shown in FIG. 1, for example, the thickness of the first semiconductor body 51s along a direction (e.g., the Y-axis direction) from the first inner film 51b toward the first outer film 51a is taken as a semiconductor body thickness ts. The semiconductor body thickness ts is, for example, not less than 5 nanometers and not more than 30 nanometers.

For example, the first structure body ST1 and the second structure body ST2 each extend in the first direction (the Z-axis direction) through the stacked body SB.

In the semiconductor memory device 110 as described below, the structure bodies are arranged in the X-axis direction and the Y-axis direction.

Figure 5:
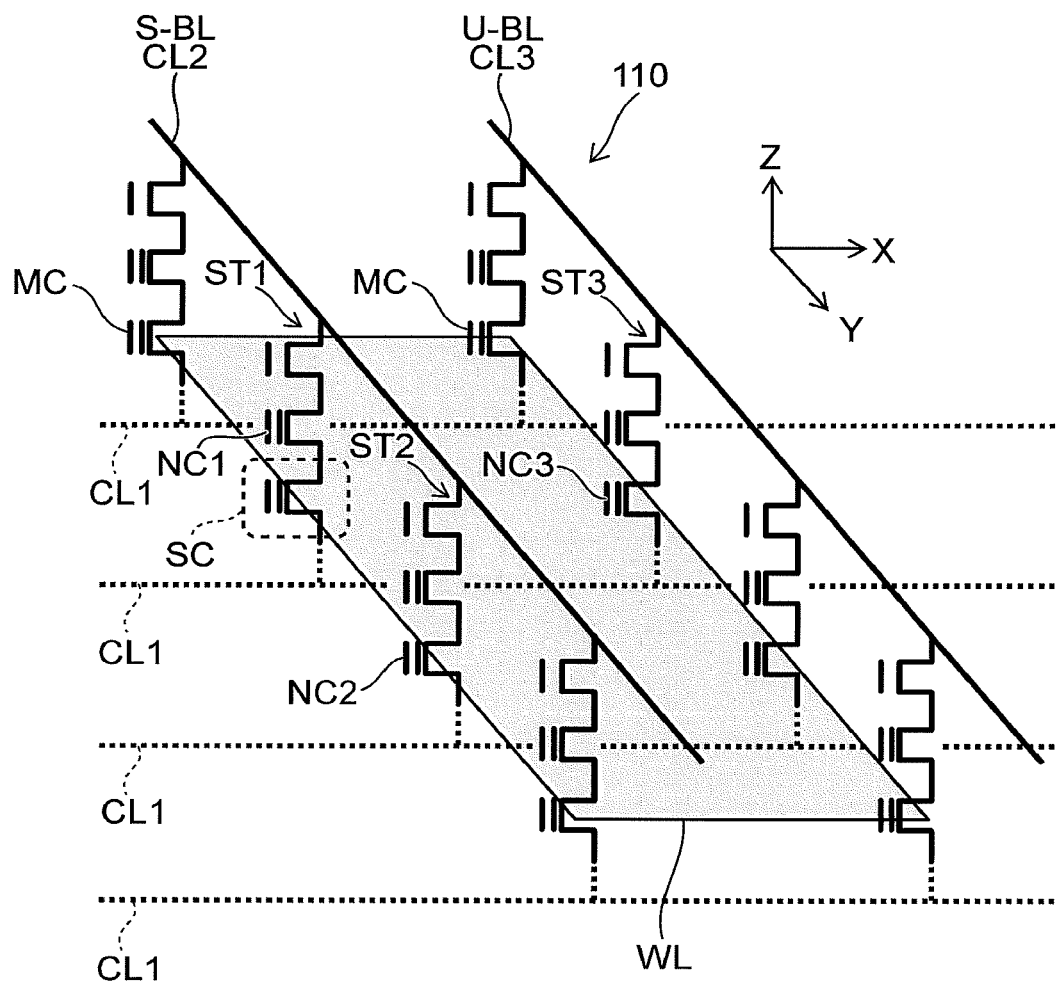
FIG. 5 is a schematic view illustrating the semiconductor memory device according to the embodiment.

FIG. 5 is a schematic view illustrating the semiconductor memory device according to the embodiment.

In the semiconductor memory device 110 as shown in FIG. 5, multiple structure bodies (e.g., the first structure body ST1 and the second structure body ST2 recited above, etc.) are provided between the first conductive layer CL1 and the second conductive layer CL2. A third conductive layer CL3 is further provided; and multiple structure bodies (e.g., a third structure body ST3) are provided between the third conductive layer CL3 and the first conductive layer CL1. The second conductive layer CL2 corresponds to a selected bit line S-BL. The third conductive layer CL3 corresponds to an unselected bit line U-BL. The structure of the third structure body ST3 is similar to, for example, that of the first structure body ST1, and a description is therefore omitted.

In one structure body (string), the multiple memory cells MC are arranged in the Z-axis direction. Such structure bodies are arranged along the X-axis direction and the Y-axis direction. The memory cells MC are arranged three-dimensionally.

The multiple electrodes WL (the multiple first electrodes 21, the multiple second electrodes 22, the multiple third electrodes 23, etc.) oppose the first structure body ST1 and oppose the third structure body ST3 as well. For example, one of the multiple electrodes WL (the multiple third electrodes 23) is the selected electrode. The selected electrode is connected to one (the selected cell SC) of the multiple transistors (the memory cells MC) included in the first structure body ST1. The selected electrode is further connected to one of the multiple transistors (the memory cells MC) included in the third structure body ST3. The one of the multiple transistors included in the third structure body ST3 corresponds to an unselected cell NC3.

When the programming of the selected cell SC is performed, for example, the second conductive layer CL2 (the selected bit line S-BL) is set to 0 volts (a voltage VSS). On the other hand, the third conductive layer CL3 (the unselected bit line U-BL) is set to 3 volts (a voltage VDDSA). Thereby, the memory cells MC that correspond to the third conductive layer CL3 are set to the unselected state.

The electrical characteristics of the selected cell SC are different from the electrical characteristics of the unselected cells (e.g., the unselected cell NC1, the unselected cell NC2, the unselected cell NC3, etc.). The unselected cells include, for example, the memory cells MC (e.g., the unselected cell NC1) included in the same string (stacked body) as the selected cell SC. The unselected cells include, for example, the memory cells MC included in the other strings connected to the same bit line (selected bit line S-BL) as the selected cell SC. The unselected cells include the memory cells MC connected to the bit lines (the unselected bit lines U-BL) that are different from that of the selected cell SC.

In the embodiment, for example, the misprogramming can be suppressed also for the unselected cell NC1 and the unselected cell NC3 in addition to the unselected cell NC2.

FIG. 6A to FIG. 6F are schematic cross-sectional views illustrating the semiconductor memory device according to the first embodiment.

These drawings are cross-sectional views when the structure shown in FIG. 1 is cut by the X-Y plane.

Figure 6A:
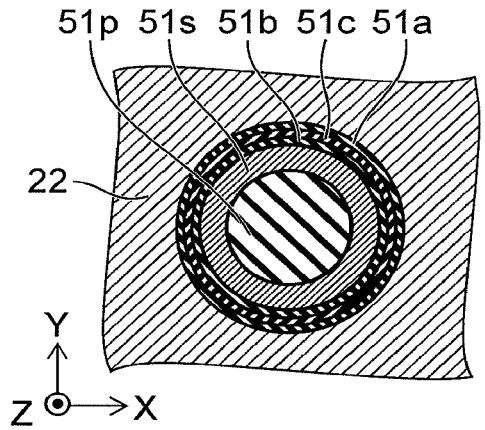
FIG. 6A to FIG. 6F are schematic cross-sectional views illustrating the semiconductor memory device according to the first embodiment.
Figure 6B:
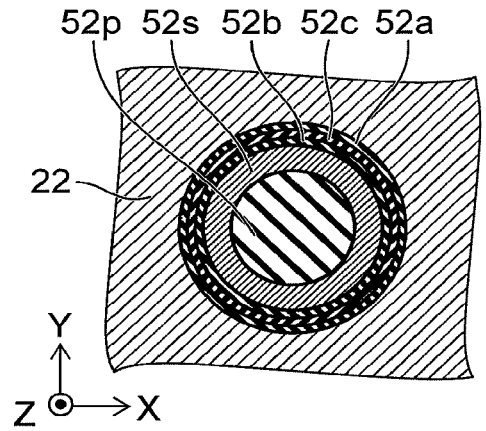
Figure 6C:
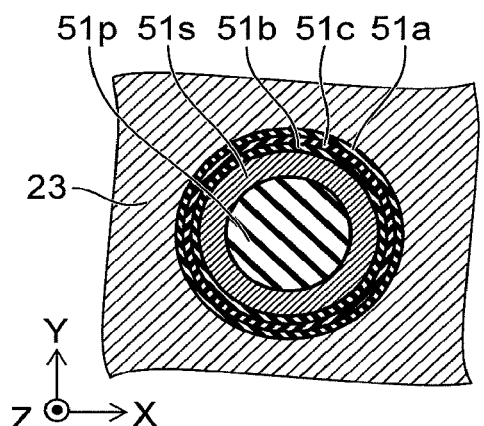
Figure 6D:
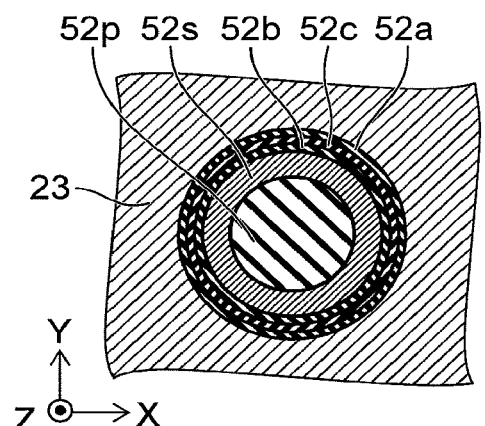
Figure 6E:
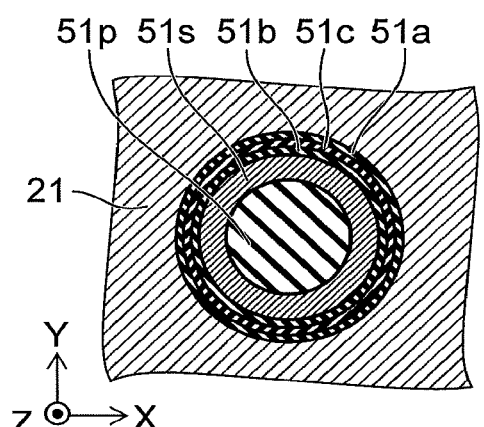

As shown in FIG. 6A, FIG. 6C, and FIG. 6E, the first inner film 51b is provided around the first semiconductor body 51s. The first intermediate film 51c is provided around the first inner film 51b. The first outer film 51a is provided around the first intermediate film 51c. In the example, the first semiconductor body 51s is provided around the first core portion 51p.

Figure 6F:
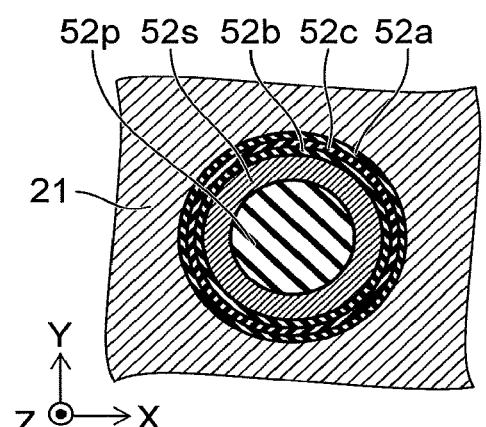

As shown in FIG. 6B, FIG. 6D, and FIG. 6F, the second inner film 52b is provided around the second semiconductor body 52s. The second intermediate film 52c is provided around the second inner film 52b. The second outer film 52a is provided around the second intermediate film 52c. In the example, the second semiconductor body 52s is provided around the second core portion 52p.

In the example shown in FIGS. 2A and 2B, in the first operation, the controller 70 sets all of the multiple third electrodes 23 other than the selected electrode to the sixth potential V06. As described in reference to the second embodiment recited below, at least one of the other multiple third electrodes 23 may be set to another potential.

Second Embodiment

Figure 7A:
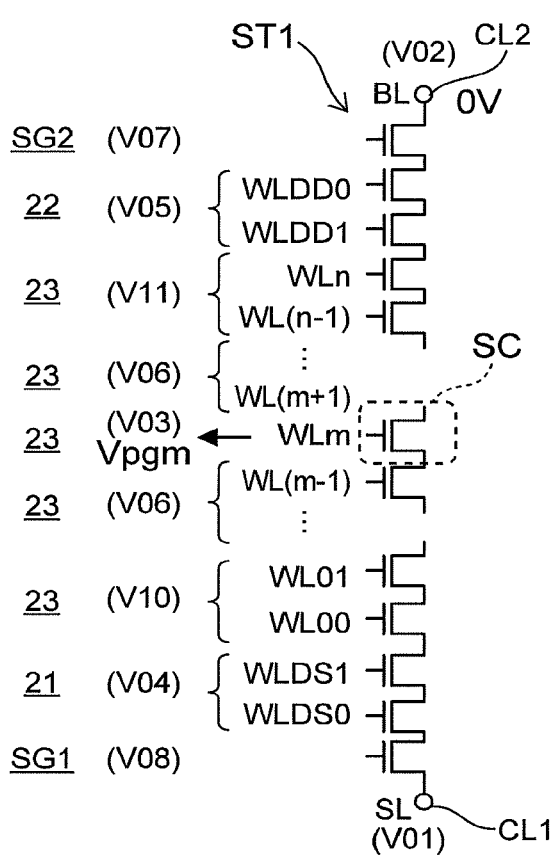
FIG. 7A and FIG. 7B are schematic views illustrating an operation of a semiconductor memory device according to a second embodiment.
Figure 7B:
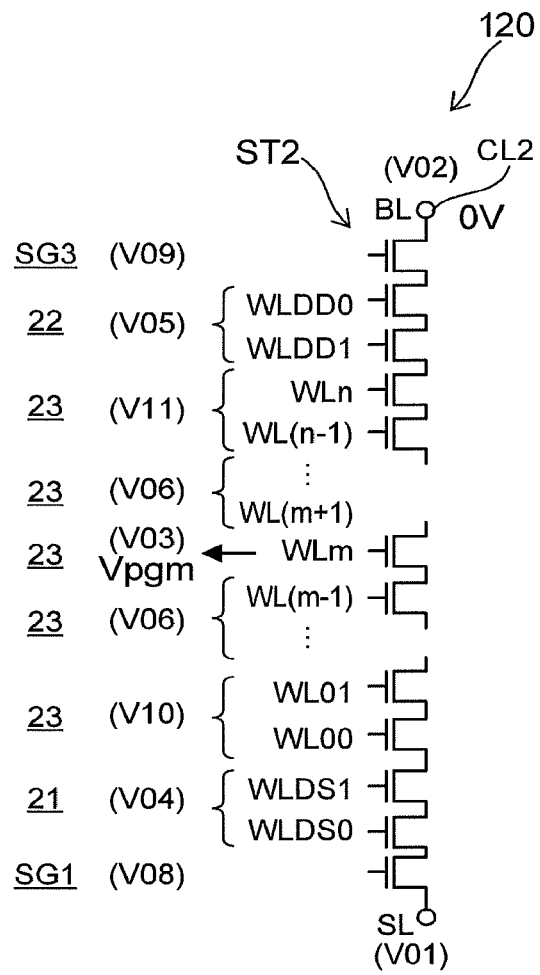

FIG. 7A and FIG. 7B are schematic views illustrating an operation of a semiconductor memory device according to a second embodiment.

FIG. 7A and FIG. 7B respectively illustrate the potentials of the string of the first structure body ST1 and the string of the second structure body ST2. In the example, one memory cell MC that is included in the string of the first structure body ST1 is the selected cell SC.

As shown in FIG. 7A and FIG. 7B, the controller 70 performs the following in the programming of the selected cell SC (the first operation). The controller 70 sets the first conductive layer CL1 to the first potential V01 and sets the second conductive layer CL2 to the second potential V02. The controller 70 sets one of the multiple third electrodes 23 to the third potential V03 described above. The controller sets the multiple first electrodes 21 to the fourth potential V04 described above and sets the multiple second electrodes 22 to the fifth potential V05 described above. The controller 70 sets, to the sixth potential V06 described above, at least one of the multiple third electrodes 23 other than the one of the multiple third electrodes 23 recited above. The controller 70 sets the second selection gate electrode SG2 to the seventh potential V07 described above. The controller 70 sets the first selection gate electrode SG1 to the eighth potential V08 described above and sets the third selection gate electrode SG3 to the ninth potential V09 described above.

In the semiconductor memory device 120 according to the embodiment, the controller 70 performs the following in the first operation. At least another one of the multiple third electrodes 23 positioned between the multiple first electrodes 21 and the at least one of the multiple third electrodes 23 recited above set to the sixth potential V06 recited above is set to a tenth potential V10. The tenth potential V10 is between the fourth potential V04 and the sixth potential V06. In the example, the tenth potential V10 is 8 V.

The controller 70 sets, to an eleventh potential V11, at least another one of the multiple third electrodes 23 positioned between the multiple second electrodes 22 and the at least one of the multiple third electrodes 23 recited above set to the sixth potential V06. The eleventh potential V11 is between the fifth potential V05 and the sixth potential V06. In the example, the eleventh potential V11 is 8 V.

In the example shown in FIGS. 7A and 7B, is an integer of 3 or more. "n" is an integer of 6 or more. "n" is larger than "m." For example, the word lines WL00 and WL01 are set to the tenth potential V10. For example, the word lines WL02 to WL(m−1) are set to the sixth potential V06. The word line WL02 is not illustrated. For example, the word line WLm is set to the third potential V03. For example, the word lines WL(m+1) to WL(n-2) are set to the sixth potential V06. The word line WL(n-2) is not illustrated. For example, the word lines WL(n-1) and WLn are set to the eleventh potential V11.

Thus, in the semiconductor memory device 120, the potential decreases sequentially to be the sixth potential V06 (the intermediate potential, e.g., 10 V) and the tenth potential V10 from the selected cell SC toward the first selection gate electrode SG1. The potential decreases sequentially to be the sixth potential V06 (the intermediate potential, e.g., 10 V) and the eleventh potential V11 from the selected cell SC toward the second selection gate electrode SG2. For example, the potential decreases monotonously toward the ends of the string. Thereby, the misprogramming to the unselected cells can be suppressed. A semiconductor memory device can be provided in which the operational stability can be improved. The misprogramming can be suppressed further. A semiconductor memory device can be provided in which the operational stability can be improved further.

For example, the absolute value of the difference between the fourth potential V04 and the first potential V01 is not less than 0.4 times but less than 0.7 times the difference between the sixth potential V06 and the first potential V01. The absolute value of the difference between the tenth potential V10 and the first potential V01 is not less than 0.7 times and not more than 0.9 times the difference between the sixth potential V06 and the first potential V01. For example, the absolute value of the difference between the eleventh potential V11 and the second potential V02 is not less than 0.7 times and not more than 0.9 times the difference between the sixth potential V06 and the second potential V02.

The configuration and materials described in reference to the semiconductor memory device 110 are applicable to the electrodes, the films, etc., that are included in the semiconductor memory device 120.

According to the embodiments, a semiconductor memory device can be provided in which the operational stability can be improved.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the semiconductor memory device such as the selection gate electrode, the first to third electrodes, the stacked body, the structure body, the semiconductor body, the outer film, the inner film, the intermediate film, the controller, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All semiconductor memory devices practicable by an appropriate design modification by one skilled in the art based on the semiconductor memory devices described above as embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention. Although several embodiments of the invention are described, these embodiments are presented as examples and are not intended to limit the scope of the invention. These novel embodiments may be implemented in other various forms; and various omissions, substitutions, and modifications can be performed without departing from the spirit of the invention. Such embodiments and their modifications are within the scope and spirit of the invention and are included in the invention described in the claims and their equivalents.

What is claimed is:

1. A semiconductor memory device, comprising:
a stacked body including a first stacked region; and
a first structure body,
the first stacked region including
    a first selection gate electrode,
    a second selection gate electrode separated from the first selection gate electrode in a first direction,
    a plurality of first electrodes arranged in the first direction and provided between the first selection gate electrode and the second selection gate electrode,
    a plurality of second electrodes arranged in the first direction and provided between the second selection gate electrode and the first electrodes, and
    a plurality of third electrodes arranged in the first direction and provided between the first electrodes and the second electrodes,
a first spacing between two mutually-adjacent first electrodes of the first electrodes being wider than a third spacing between two mutually-adjacent third electrodes of the third electrodes,
a second spacing between two mutually-adjacent second electrodes of the second electrodes being wider than the third spacing,
the first structure body including
    a first semiconductor body extending in the first direction,
    a first outer film provided between the first semiconductor body and the first stacked region,
    a first inner film provided between the first semiconductor body and the first outer film, and
    a first intermediate film provided between the first outer film and the first inner film.

2. The device according to claim 1, further comprising:
a second structure body;
a first conductive layer; and
a second conductive layer,
the stacked body further including a third selection gate electrode, a direction connecting the second selection gate electrode and the third selection gate electrode and being aligned with a second direction, the second direction crossing the first direction,
the first selection gate electrode including a first selection gate region separated from the third selection gate electrode in the first direction,
the first electrodes including a first electrode region between the first selection gate region and the third selection gate electrode,
the second electrodes including a second electrode region between the first selection gate region and the first electrode region,
the third electrodes including a third electrode region between the first electrode region and the second electrode region,
the stacked body including a second stacked region, the second stacked region including the first selection gate region, the third selection gate electrode, the first electrode region, the second electrode region, and the third electrode region,
the second structure body including
    a second semiconductor body extending in the first direction,
    a second outer film provided between the second semiconductor body and the second stacked region,
    a second inner film provided between the second semiconductor body and the second outer film, and
    a second intermediate film provided between the second outer film and the second inner film,
the first semiconductor body including a first end portion and a second end portion,
the second semiconductor body including a third end portion and a fourth end portion,
the first conductive layer being electrically connected to the first end portion and the third end portion,
the second conductive layer being electrically connected to the second end portion and the fourth end portion.

3. The device according to claim 2, further comprising a controller electrically connected to the first conductive layer, the second conductive layer, the first selection gate electrode, the second selection gate electrode, the first electrodes, the second electrodes, and the third electrodes,
the controller being configured to perform a first operation of
    setting the first conductive layer to a first potential,
    setting the second conductive layer to a second potential,
    setting one of the third electrodes to a third potential higher than the first potential and higher than the second potential,
    setting the first electrodes to a fourth potential between the first potential and the third potential,
    setting the second electrodes to a fifth potential between the second potential and the third potential,
    setting at least one other third electrode of the third electrodes other than the one of the third electrodes to a sixth potential, the sixth potential being between the fourth potential and the third potential and between the fifth potential and the third potential,
    setting the second selection gate electrode to a seventh potential lower than the fourth potential and lower than the fifth potential,
    setting the first selection gate electrode to an eighth potential lower than the seventh potential, and
    setting the third selection gate electrode to a ninth potential lower than the seventh potential.

4. The device according to claim 3, wherein
in the first operation, the controller is configured to perform setting, to a tenth potential, at least another one of the third electrodes positioned between the first electrodes and the at least one of the third electrodes set to the sixth potential, and setting, to an eleventh potential, at least another one of the third electrodes positioned between the second electrodes and the at least one of the third electrodes set to the sixth potential, the tenth potential being between the fourth potential and the sixth potential, the eleventh potential being between the fifth potential and the sixth potential.

5. The device according to claim 4, wherein the absolute value of a difference between the tenth potential and the sixth potential is 2 volts or less.

6. The device according to claim 1, further comprising a base body, the stacked body being provided on a surface of the base body, the first direction crossing the surface.

7. The device according to claim 1, wherein the first structure body extends in the first direction through the stacked body.

8. The device according to claim 3, wherein the absolute value of a difference between the sixth potential and the first potential is not less than 0.4 times and not more than 0.6 times the absolute value of a difference between the third potential and the first potential.

9. The device according to claim 3, wherein the absolute value of a difference between the fourth potential and the first potential is not less than 0.4 times and not more than 0.8 times a difference between the sixth potential and the first potential.

10. The device according to claim 3, wherein the controller is configured to set all of the other third electrodes of the stacked body to the sixth potential in the first operation.

11. The device according to claim 4, wherein the absolute value of a difference between the fourth potential and the first potential is not less than 0.4 times but less than 0.7 times a difference between the sixth potential and the first potential.

12. The device according to claim 4, wherein the absolute value of a difference between the tenth potential and the first potential is not less than 0.7 times and not more than 0.9 times a difference between the sixth potential and the first potential.

13. The device according to claim 1, wherein a ratio of a first length to the total of the first length, a second length, and a third length is not less than 0.05 and not more than 0.15, the first length being a length in the first direction of a region including the first electrodes, the second length being a length in the first direction of a region including the second electrodes, the third length being a length in the first direction of a region including the third electrodes.

14. The device according to claim 1, wherein the controller is configured to further implement a second operation of setting a potential of at least one of the third electrodes to be lower than a potential of the first conductive layer and lower than a potential of the second conductive layer.

15. The device according to claim 1, wherein
the controller is configured to further implement a third operation of
setting the first conductive layer to a twelfth potential,
setting the second conductive layer to a thirteenth potential different from the twelfth potential, and
setting at least one of the third electrodes to a fourteenth potential,
the absolute value of a difference between the fourteenth potential and the twelfth potential and the absolute value of a difference between the fourteenth potential and the thirteenth potential being less than the absolute value of a difference between the third potential and the first potential.

16. The device according to claim 1, wherein
a difference between the first spacing and the third spacing is not less than 2 nanometers and not more than 10 nanometers, and
a difference between the second spacing and the third spacing is not less than 2 nanometers and not more than 10 nanometers.

17. The device according to claim 1, wherein
the first spacing is not less than 1.05 times and not more than 1.5 times the third spacing, and
the second spacing is not less than 1.05 times and not more than 1.5 times the third spacing.

18. The device according to claim 1, wherein a thickness of the first semiconductor body along a direction from the first inner film toward the first outer film is not less than 10 nanometers and not more than 30 nanometers.

19. The device according to claim 7, wherein
the first inner film is provided around the first semiconductor body,
the first intermediate film is provided around the first inner film, and
the first outer film is provided around the first intermediate film.

20. The device according to claim 7, wherein
the first structure body further includes a first core portion extending in the first direction, and
the first semiconductor body is provided around the first core portion.

* * * * *